US009484910B2

(12) United States Patent
Mai

(10) Patent No.: US 9,484,910 B2
(45) Date of Patent: Nov. 1, 2016

(54) ZERO-CURRENT POR CIRCUIT

(71) Applicant: CAPITAL MICROELECTRONICS CO., LTD, Beijing (CN)

(72) Inventor: Rifeng Mai, Beijing (CN)

(73) Assignee: Capital Microelectronics Co., Ltd., Beijing (CN)

( * ) Notice: Subject to any disclaimer, the term of this patent is extended or adjusted under 35 U.S.C. 154(b) by 235 days.

(21) Appl. No.: 14/389,407

(22) PCT Filed: Mar. 19, 2014

(86) PCT No.: PCT/CN2014/073712
§ 371 (c)(1),
(2) Date: Sep. 30, 2014

(87) PCT Pub. No.: WO2015/109649
PCT Pub. Date: Jul. 30, 2015

(65) Prior Publication Data

US 2016/0261264 A1 Sep. 8, 2016

(30) Foreign Application Priority Data

Jan. 26, 2014 (CN) .......................... 2014 1 0038090

(51) Int. Cl.

| | |
|---|---|
| *H03K 17/22* | (2006.01) |
| *H03K 17/284* | (2006.01) |
| *H03K 3/037* | (2006.01) |

(52) U.S. Cl.
CPC .......... *H03K 17/223* (2013.01); *H03K 3/0377* (2013.01); *H03K 17/284* (2013.01)

(58) Field of Classification Search
CPC .................................................... H03K 17/223
See application file for complete search history.

(56) References Cited

U.S. PATENT DOCUMENTS 8,692,593 B1 * 4/2014 Zhang ....................... G06F 1/30 327/142
8,963,590 B2 * 2/2015 Guimont ............. H03K 17/223 327/142

* cited by examiner

*Primary Examiner* — Hai L Nguyen
(74) *Attorney, Agent, or Firm* — Buchanan Ingersoll & Rooney PC

(57) ABSTRACT

A power-on reset (POR) circuit includes an RC circuit; a Schmitt trigger, an inverter, and a first PMOS tube. A power supply voltage charges a capacitor through the RC circuit. When a voltage of the capacitor reaches a first threshold, the Schmitt trigger reverses, a first level is output. The POR circuit includes a discharge circuit used to detect a glitch of the power supply voltage, and output a first signal to an input end of the Schmitt trigger when the glitch is detected. The first signal allows the Schmitt trigger to reverse again to output a second level, so as to turn off the first PMOS tube through the inverting amplifier. When the power supply voltage rises along an oblique line again, the Schmitt trigger reverses, and the first level is output, so as to reset the system where the circuit is.

5 Claims, 3 Drawing Sheets

VDD 202 208 206 210 R a Va C 204 ~RST

VDD PG 310 304 Vb Va b 306 308 312 NG 302

ZERO-CURRENT POR CIRCUIT

BACKGROUND

1. Technical Field

The present invention relates to a power-on reset (POR) circuit, and more particularly to a zero-power POR circuit.

2. Related Art

A POR circuit is a circuit used to ensure provision of a global reset signal to a system during an initial stage in which powering up of a semiconductor device starts, so as to ensure that the whole device starts in a determined state.

FIG. 1 is a schematic view of a conventional POR circuit. As shown in FIG. 1, at the beginning of application of a power supply to a circuit, a power supply voltage VDD rises from zero along an oblique line, so as to charge a capacitor C through a resistor R. When the capacitor C is being charged, a voltage of a node Va follows the voltage VDD. When Va increases to a certain threshold, a Schmitt trigger 10 reverses, a signal ~RST is of a high level, and the high level signal ~RST provides a global reset signal for the system, so as to ensure that the whole system starts in a determined state. Meanwhile, the high level signal ~RST turns on a PMOS tube 14 through an inverting amplifier 12, so as to short-circuit the capacitor C to VDD. In a case where the power supply voltage is stable, the whole reset circuit consumes no quiescent current, and does not cause power consumption.

However, the power supply voltage may be unstable, and a glitch or a brief decrease may occur, the duration of which may be hundreds of microseconds or may be up to the order of milliseconds. Generally, the RC in the POR circuit is large, and Va decreases very slightly, and cannot decrease to a second threshold that makes the Schmitt trigger 10 to reverse again. Therefore, in the case of a power supply glitch, ~RST is very likely to be still kept at the high level. For some types of electronic apparatuses, for example portable apparatuses, the apparatuses may be frequently turned on and off, so that VDD decreases briefly. However, when the POR circuit shown in FIG. 1 is adopted, in the case of a power supply glitch or a brief decrease of the power supply voltage, the electronic apparatus cannot be reset normally, so that functions of components may be in chaos.

SUMMARY

An objective of the present invention is to provide a circuit capable of eliminating the foregoing defects.

An embodiment of the present invention provides a POR circuit. The POR circuit includes an RC circuit; a Schmitt trigger, the Schmitt trigger having a first threshold and a second threshold; an inverter; and a first PMOS tube; where when a power supply voltage is powered, the power supply voltage charges a capacitor through the RC circuit; when a voltage of the capacitor reaches the first threshold, the Schmitt trigger reverses, a first level is output, so as to reset a system where the circuit is; the POR circuit includes a discharge circuit used to detect a brief decrease of the power supply voltage, and output a first signal to an input end of the Schmitt trigger when the glitch is detected; the first signal allows the Schmitt trigger to reverse again to output a second level, so as to turn off the first PMOS tube through the inverting amplifier; when the power supply voltage rises along an oblique line again, the Schmitt trigger reverses, and the first level is output, so as to reset the system where the circuit is.

Preferably, the discharge circuit includes a detection circuit used to detect the glitch of the power supply voltage; and conduct a second PMOS tube when the glitch is detected, to make the second PMOS tube output the first signal.

Preferably, the discharge circuit includes a third PMOS tube and a first NMOS tube having drains and sources connected respectively, and a control circuit, and the control circuit controls a gate of the third PMOS tube and a gate of the first NMOS tube, so that during the glitch of the power supply voltage, the third PMOS tube and the first NMOS tube are turned on, so as to transmit the first signal of a drain of the second PMOS tube to the input end of the Schmitt trigger.

Preferably, the control circuit includes a hold circuit used to keep the voltage stable during the glitch of the power supply voltage; a fourth PMOS, having a gate connected to the power supply voltage, a drain receiving an output voltage of the hold circuit, and a source; an inverter, an input end of the inverter being connected to the source of the fourth PMOS; a fifth PMOS tube, having a gate and a source both connected to the power supply voltage, and a drain connected to an output end of the inverter.

Preferably, the hold circuit is an RC circuit.

The POR circuit according to the embodiment of the present invention can effectively eliminate the problem of system state disorder caused by a power supply glitch.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The present invention is described below in detail, clearly, and completely with reference to the accompanying drawings and specific embodiments. It is obvious that the embodiments to be described are only a part rather than all of the embodiments of the present invention. All other embodiments obtained by persons of ordinary skill in the art based on the embodiments of the present invention without creative efforts shall fall within the protection scope of the present invention.

Figure 1:
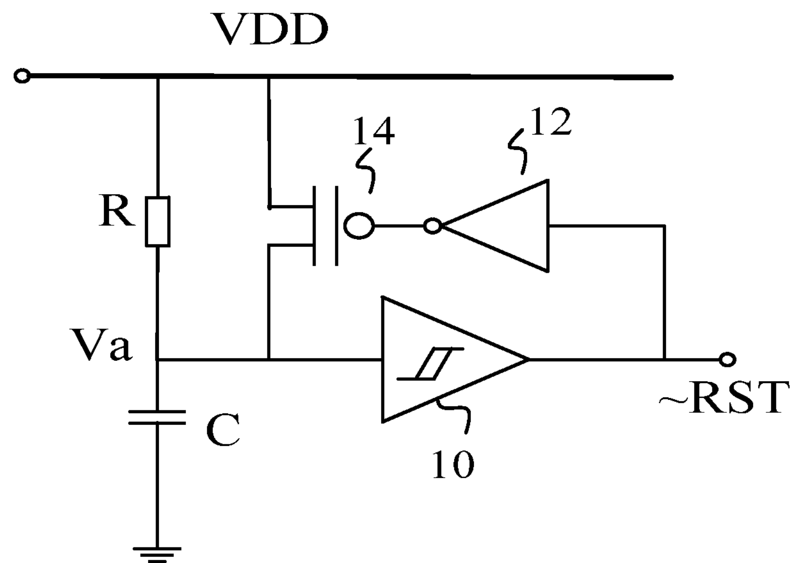
FIG. 1 is a schematic view of a conventional POR circuit.
Figure 2:
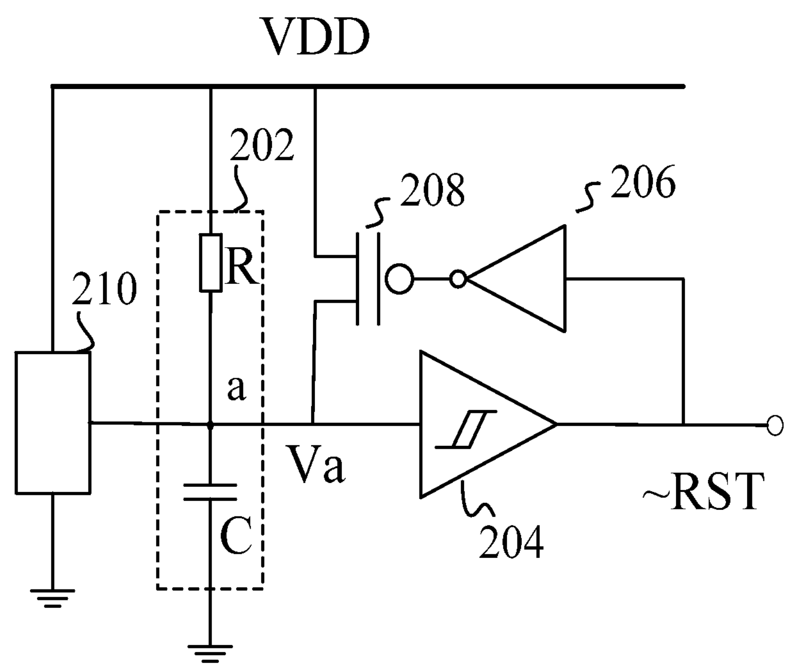
FIG. 2 is a POR circuit according to an embodiment of the present invention.

FIG. 2 is a POR circuit according to an embodiment of the present invention. As shown in FIG. 2, the POR circuit includes a conventional POR circuit, and the POR circuit further includes a discharge circuit 210.

The conventional POR circuit includes an RC circuit 202, a Schmitt trigger 204, an inverter 206, and a PMOS tube 208. The RC circuit 202 is formed by a resistor R and a capacitor C. The Schmitt trigger 204 has two reverse thresholds, namely a first threshold and a second threshold. When a power supply voltage VDD is powered, VDD starts charging the capacitor C through the RC circuit 202, and as VDD increases, a voltage at two ends of the capacitor C increases gradually. When a voltage Va at a node a reaches the first threshold, the Schmitt trigger 204 reverses, and a high level is output, so as to reset each circuit/component/module of a system where the circuit is. A high level signal ~RST turns on the PMOS tube 208 through an inverting amplifier 206, so as to short-circuit the capacitor C to VDD. In a case where the power supply voltage is stable, the whole reset circuit consumes no quiescent current, and does not cause power consumption. POR time depends on an RC value. If resistance of the resistor is 100 kΩ, and capacitance of C is 10 pF, resetting may be completed in about 1 μs.

If VDD undergoes a power supply glitch or a glitch for hundreds of microseconds or even milliseconds, since the RC is generally very large, Va does not decrease greatly, and cannot reach the second threshold that makes the Schmitt trigger 204 to reverse again. ~RST will still be kept at the high level.

The discharge circuit 210 is used to detect a glitch of the voltage VDD, and output a low level to the node a when the glitch is detected, so that Va follows VDD in short time to undergo a glitch. When the glitch causes Va to reach the second threshold that can make the Schmitt trigger 204 reverse again, an output signal ~RST of the Schmitt trigger 204 changes into a low level, and the low level turns off the PMOS tube 208 through the inverting amplifier 206.

When VDD rises again from the voltage, after the glitch, along an oblique line, as stated above, the output signal ~RST of the Schmitt trigger 204 is set to the high level again, and each module of the system is reset again.

Figure 3:
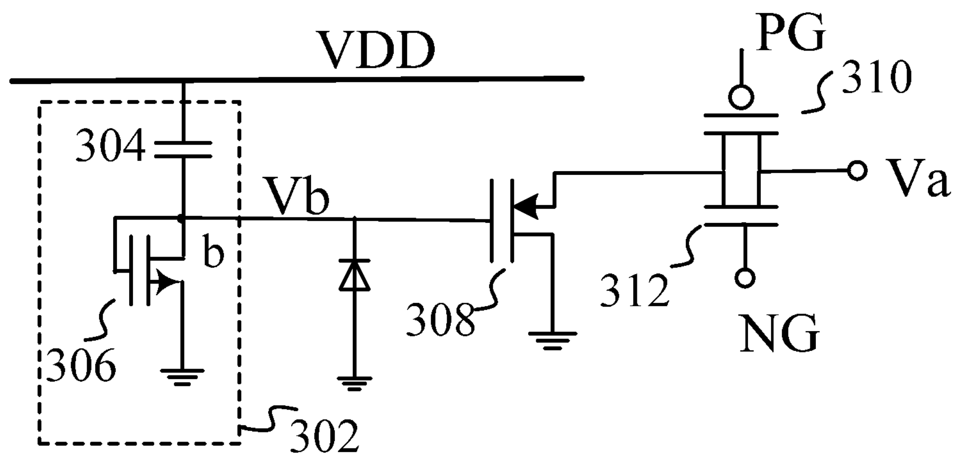
FIG. 3 is a schematic view of a discharge circuit.

FIG. 3 is a schematic view of the discharge circuit 210. As shown in FIG. 3, the discharge circuit includes a VDD detection circuit 302. The VDD detection circuit 302 may be formed by a capacitor 304 and a resistor 306. In an example, the resistor 306 may be formed by a CMOS tube, which has high resistance, for example 10 MΩ. In an example, the capacitor 304 is a real capacitor, and may be a high-capacitance capacitor, and for example, capacitance of the capacitor is multiple pF. When VDD is stable, a voltage between two ends of the capacitor 304 is equal to VDD, and a voltage Vb of a node b is zero. When the voltage VDD undergoes a glitch, due to a large RC constant of the capacitor 304 and the resistor 306, the voltage Vb of the node b substantially changes with VDD.

The discharge circuit further includes a PMOS tube 308. The PMOS tube 308 may be a tube with low impedance, for example an MOS tube with W/L being large. When a glitch of the voltage VDD, for example a decrease of the voltage, reaches $V_{th,\ pmos}$, and a decrease of the voltage Vb of the node b is also substantially Vth, since a source voltage of the PMOS tube 308 substantially remains unchanged, a difference Vgs between a gate voltage of the PMOS tube 308 and the source voltage of the PMOS tube 308 is greater than a voltage threshold of the PMOS tube 308, the PMOS tube 308 is conducted, and a source thereof discharges through the ground, so as to lower the source voltage of the PMOS tube.

The discharge circuit may further include a pair of MOS tubes, namely a PMOS tube 310 and an NMOS tube 312, respective drains (or sources) are connected, and are connected to the source of the PMOS tube 308; the respective drains (or sources) are connected, so as to provide a voltage signal of the node a.

Figure 5:
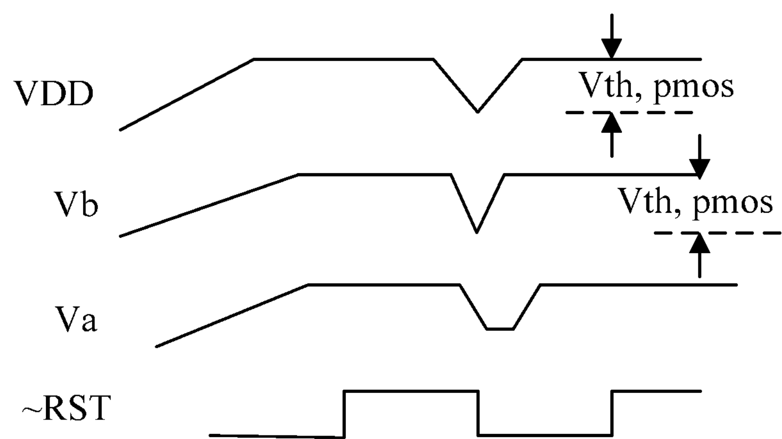
FIG. 5 is a schematic view of signal waveforms of the circuit in FIG. 3.

The PMOS tube 310 and the NMOS tube 312 are normally turned off, so as not to affect operation of the POR circuit in a normal situation. If a gate PG of the PMOS tube 310 and a gate of the NMOS tube 312 are controlled to turn on the PMOS tube and the NMOS tube during a glitch of the voltage VDD, a low level of the drain of the NMOS tube is transmitted to the node a. FIG. 5 is a schematic view of signal waveforms of the circuit in FIG. 3.

According to needs, values of the resistor 306 and the capacitor 304 may be selected or a W/L value of the PMOS 308 may be adjusted, so as to adjust speed of response of the discharge circuit to the glitch of the voltage VDD.

Further, the discharge circuit may be provided with a delay circuit, so as to reset the system again only when the duration of the glitch of the power supply voltage is long enough.

Figure 4:
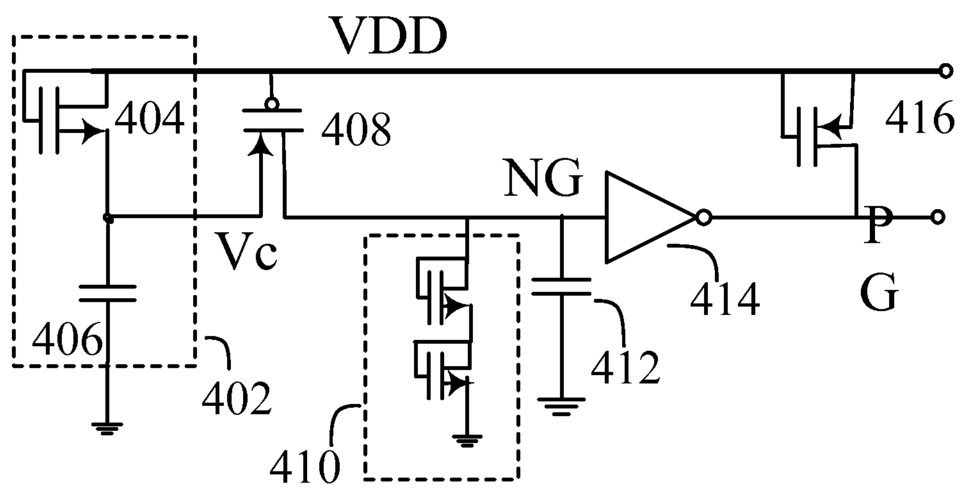
FIG. 4 is a schematic view of a gate control circuit of a PMOS tube and an NMOS tube.

FIG. 4 is a schematic view of a gate control circuit of the PMOS tube 310 and the NMOS tube 312. As shown in FIG. 4, the control circuit includes a hold circuit 402 used to generate a stable voltage during a glitch of the voltage VDD. In an example, it is formed by a resistor 404 and a capacitor 406. The resistor 404 may be formed by a CMOS tube. The capacitance of the capacitor 406 may be greater than, for example, 20 pF. A voltage of a node c is stabilized at a certain level during the glitch of the voltage VDD.

The control circuit includes a PMOS 408, a gate thereof is connected to VDD, a source thereof is connected to the node c, and a drain thereof is grounded at a node NG through a resistor 410. The resistor 410 may be formed by a single NMOS tube, and may also be formed by NMOS tubes connected in series. During a glitch of VDD, the PMOS tube 408 is turned on, so that Vc is transmitted to the node NG.

The control circuit includes an inverter 414, an input end of the inverter is connected at the node NG and is grounded through a capacitor 412, and an output end of the inverter is a node PG. The capacitor 412 has a function of filtering.

The control circuit includes a NMOS tube 416, a gate and a source thereof are both connected to VDD, and a drain thereof is connected to the node PG.

During the glitch of the voltage VDD, the hold circuit 402 keeps Vc at a high level, but the NMOS tube 408 is turned on, so that the high level is transmitted to the node NG. During the glitch of VDD, the NMOS tube 416 is also turned off, so that the output end PG of the inverter is also kept at the low level. Therefore, the PMOS tube 310 and the NMOS tube 312 are conducted.

Figure 6:
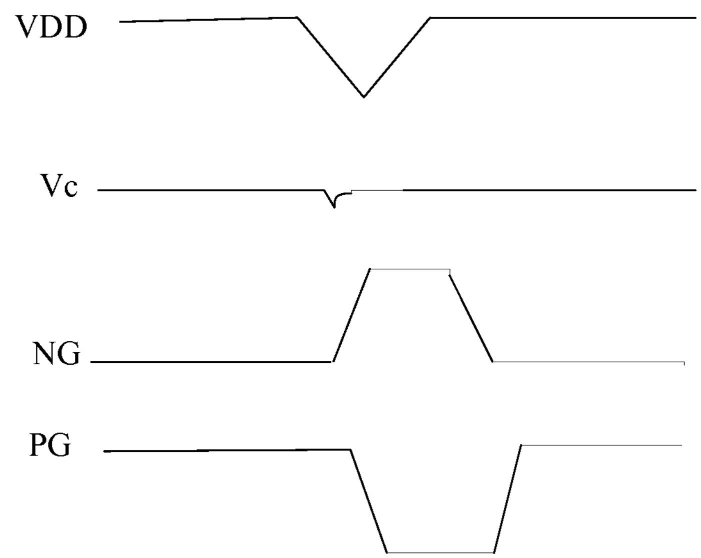
FIG. 6 is a schematic view of signal waveforms of the circuit in FIG. 4.

When VDD returns to a stable voltage, the PMOS tube 408 is turned off, and the capacitor 412 discharges through the resistor 410, so that NG lowers. Meanwhile, the NMOS tube 416 is turned on, and PG is raised. Refer to FIG. 6 for signal waveforms.

The objectives, technical solutions, and beneficial effects of the present invention have been described in further detail through the above specific embodiments. It should be understood that the above descriptions are merely specific embodiments of the present invention, but not intended to limit the protection scope of the present invention. Any modification, equivalent replacement, or improvement made without departing from the spirit and principle of the present invention should fall within the scope of the present invention.

What is claimed is:

1. A power-on reset (POR) circuit, comprising:

an RC circuit;

a Schmitt trigger, the Schmitt trigger having a first threshold and a second threshold;

an inverter; and a first positive channel metal oxide semiconductor (PMOS) tube;

wherein when a power supply voltage is powered, the power supply voltage charges a capacitor through the RC circuit;

when a voltage of the capacitor reaches the first threshold, the Schmitt trigger reverses, and a reset signal of a first level is output, so as to reset a system in which the circuit is; meanwhile, the reset signal of the first level turns on the first PMOS tube through the inverting amplifier, so as to short-circuit the capacitor to the power supply voltage;

the POR circuit further comprises a discharge circuit used to detect a glitch of the power supply voltage, and to output a first signal to an input end of the Schmitt trigger when the glitch is detected;

the first signal allows the Schmitt trigger to reverse again to output a second level, so as to turn off the first PMOS tube through the inverting amplifier;

when the power supply voltage rises along an oblique line again, the Schmitt trigger reverses, and the first level is output, so as to reset the system in which the circuit is.

2. The POR circuit according to claim 1, wherein the discharge circuit comprises a detection circuit used to detect the glitch of the power supply voltage; and conduct a second PMOS tube when the glitch is detected, to make the second PMOS tube output the first signal.

3. The POR circuit according to claim 2, wherein the discharge circuit comprises a third PMOS tube and a first NMOS tube having drains and sources connected respectively, and a control circuit, and the control circuit controls a gate of the third PMOS tube and a gate of the first NMOS tube, so that during the glitch of the power supply voltage, the third PMOS tube and the first NMOS tube are turned on, so as to transmit the first signal of a drain of the second PMOS tube to the input end of the Schmitt trigger (204).

4. The POR circuit according to claim 3, wherein the control circuit comprises:

a hold circuit used to keep the voltage stable during the glitch of the power supply voltage;

a fourth PMOS, having a gate connected to the power supply voltage, a drain receiving an output voltage of the hold circuit, and a source;

an inverter, an input end of the inverter being connected to the source of the fourth PMOS;

a fifth PMOS tube, having a gate and a source both connected to the power supply voltage, and a drain connected to an output end of the inverter.

5. The POR circuit according to claim 3, wherein a hold circuit is an RC circuit.

* * * * *